United States Patent [19]

Okada et al.

[11] 4,247,948
[45] Jan. 27, 1981

[54] AUTOMATIC MODULATION CONTROL IN TRANSMITTER

[75] Inventors: Hisao Okada, Neyagawa; Yukihiro Kawamoto, Osaka, both of Japan

[73] Assignee: Sanyo Electric Co., Ltd., Moriguchi, Japan

[21] Appl. No.: 968,797

[22] Filed: Dec. 12, 1978

[30] Foreign Application Priority Data

Dec. 29, 1977 [JP] Japan .................. 52-157810

[51] Int. Cl.$^3$ .............................................. H04B 1/04
[52] U.S. Cl. ............................... 455/116; 179/1 VL; 332/38; 455/117
[58] Field of Search ............... 325/159, 150, 187, 144; 179/1 F, 1 VL; 332/37 D, 38; 455/116, 117, 126

[56] References Cited

U.S. PATENT DOCUMENTS

| | | | |
|---|---|---|---|
| 2,750,451 | 6/1956 | Crow | 325/187 |
| 3,398,381 | 8/1968 | Torick et al. | 325/187 |
| 3,533,006 | 10/1970 | Kubicz | 179/1 VL |

*Primary Examiner*—Marc E. Bookbinder
*Attorney, Agent, or Firm*—Darby & Darby

[57] ABSTRACT

An automatic modulation control in a transmitter, comprising an alternating modulation signal source, a modulation signal amplifier, a carrier generator, a modulator for modulating the carrier signal as a function of the output of the modulation signal amplifier, a threshold detector coupled in a direct current manner to the output of the modulation signal amplifier for threshold detecting the modulation signal output, a smoothing circuit for smoothing the threshold detected output, an amplifier for the threshold detected and smoothed output, and a control circuit for controlling the input of the modulation signal to the modulation signal amplifier as a function of the output of the threshold detected output amplifier.

13 Claims, 10 Drawing Figures

AUTOMATIC MODULATION CONTROL IN TRANSMITTER

BACKGROUND OF THE INVENTION

1. Field of the Invention

The present invention relates to an automatic modulation control in a transmitter. More specifically, the present invention relates to an improvement in an automatic modulation control in a transmitter which is switchable as a receiver as in case of a transceiver.

2. Description of the Prior Art

An automatic modulation control is provided in a transmitter for the purpose of preventing overmodulation and preventing energy distribution from being widespread in terms of the occupied bandwidth. Necessity of an automatic modulation control is also ruled by Federal Communications Commission of the United States.

The major important requirements for an automatic modulation control are listed in the following.

(1) A stabilized feedback operation without overmodulation in a necessary frequency band.

(2) No variation in the modulation percentage in spite of variation of the temperature and the source voltage.

(3) A quick response rate to variation of the modulation percentage.

(4) A predetermined modulation factor performed throughout a wider range of the input, i.e. a wide dynamic range for allowing for control of modulation.

(5) No frequency dependent characteristic with respect to an input voltage for operation of an automatic modulation control.

(6) Inexpensive implementation and simple adjustment.

Figure 1:
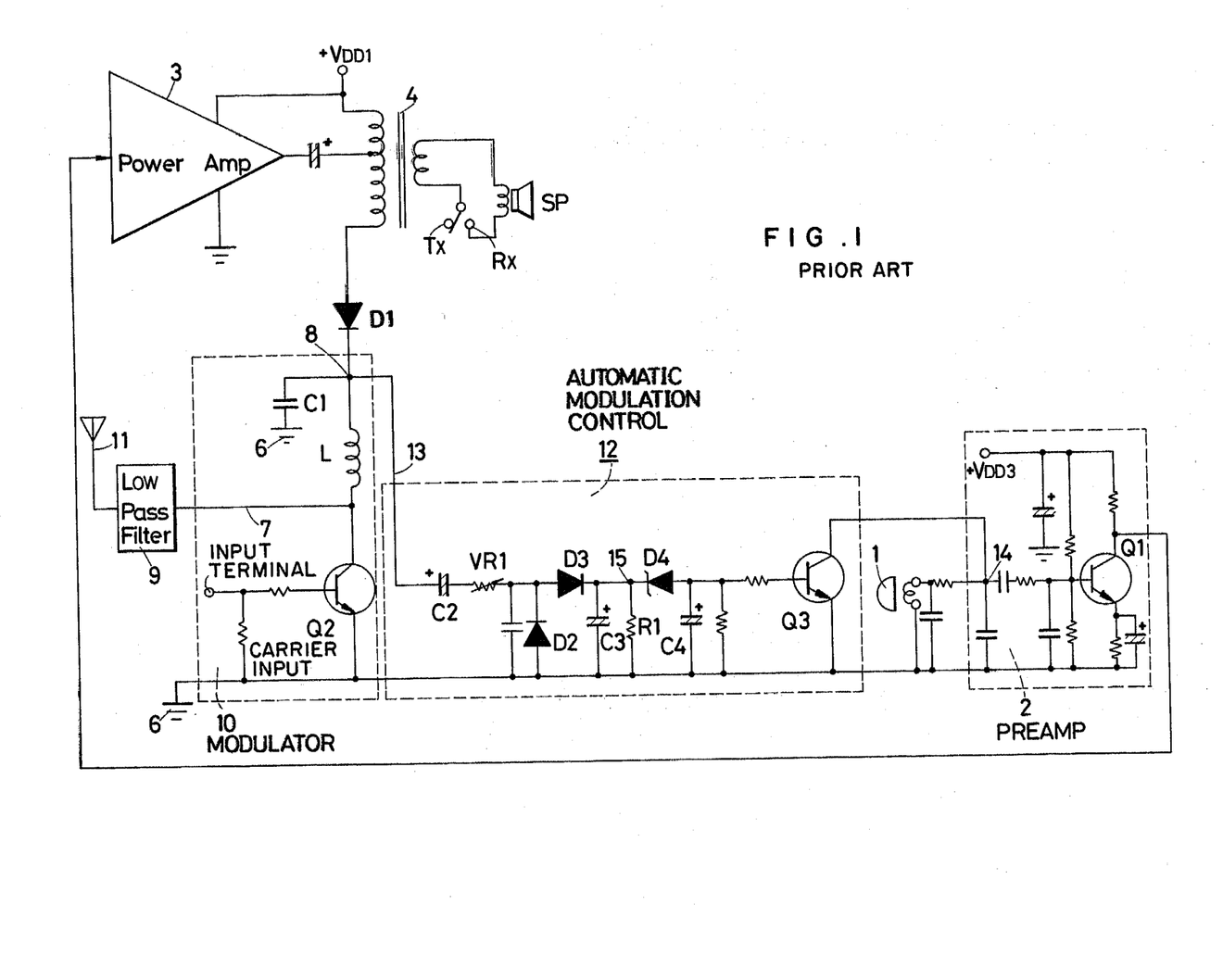
FIG. 1 is a schematic diagram, partially in a block form, of a transmitter portion of the FIG. 1A transceiver, centering on an automatic modulation control.
Figure 1A:
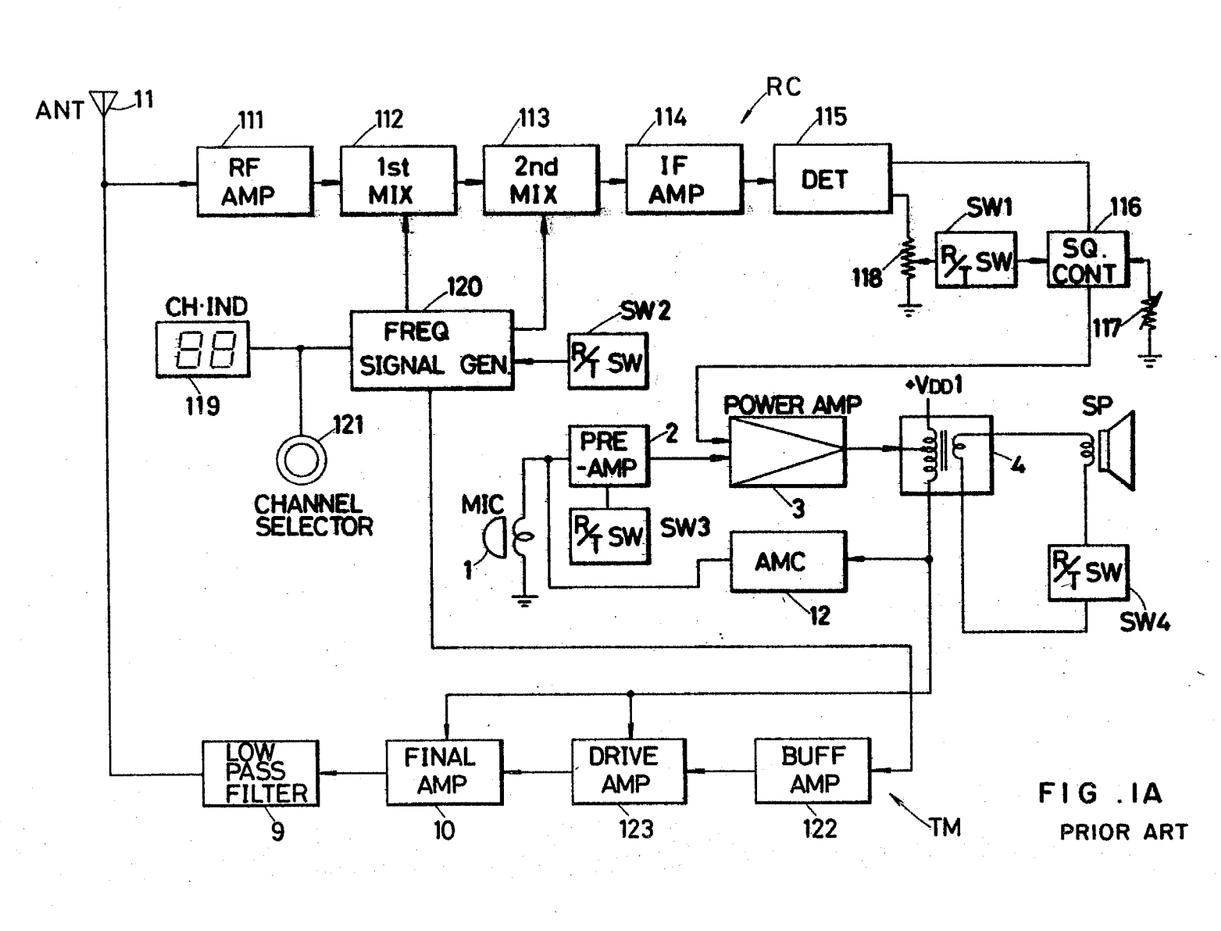
FIG. 1A is a block diagram of a typical conventional transceiver employing an automatic modulation control.

FIG. 1A shows a block diagram of a typical conventional transceiver employing an automatic modulation control in a transmitter mode. The transceiver shown comprises a receiver portion RC for receiving a transmitted wave signal to convert the same into an audible sound, and a transmitter portion TM for converting an audible sound into a transmitting wave to transmit the same. Such transceiver may comprise a frequency signal generator 120, which may be implemented by a frequency synthesizer employing a phase-locked loop, for providing a local oscillation frequency output and a carrier frequency output to the receiver portion RC and the transmitter portion TM, respectively, and a transmitter/receiver selection switches SW1, SW2, SW3 and SW4, which are coupled in a ganged fashion to a press-to-talk switch for selectively switching a transmitting mode or receiving mode of the transceiver.

The receiver portion RC comprises an antenna 11 for receiving a transmitted wave, a high frequency amplifier 111 for amplifying the received wave signal, a first mixer 112 for mixing the high frequency output from the amplifier 111 with a first local oscillation frequency output from the frequency signal generator 120 for providing a first intermediate frequency output, a second mixer 113 for mixing the first intermediate frequency output from the first mixer 112 with a second local oscillation frequency output from the frequency signal generator 120 for providing a second intermediate frequency output, an intermediate frequency amplifier 114 for amplifying the second intermediate frequency output from the second mixer 113, a detector 115 for detecting the intermediate frequency output from the amplifier 114 for providing an audio frequency amplifier, a power amplifier 3 for amplifying the audio frequency output from the detector 115, and a loudspeaker SP for transducing the audio frequency output from the amplifier 3 into a sound output. Preferably, a squelch control 116 is coupled to the detector 115 which is selectively operable in the receiver mode by virtue of selection of the transmitter/receiver selection switch SW1 at a predetermined level as preset by a variable resistor 117. An output transformer 4 is interposed between the power amplifier 3 and the loud speaker SP. A variable resistor 118 is coupled to the detector 115 for the purpose of volume control of the audio frequency output.

The transmitter portion TM comprises a microphone 1 for converting a sound into an audio electrical signal, a preamplifier 2 for amplifying the audio electrical signal, an audio amplifier shared by the above described power amplifier 3 for power amplifying the audio electrical signal from the microphone 1, a modulator including a buffer amplifier 122, a driver amplifier 123 and a final stage amplifier 10 for modulating a carrier signal of the carrier frequency output from the frequency signal generator 120 with the amplified audio signal for providing a modulated signal, a low pass filter or bandpass filter 9 for selectively withdrawing the modulated signal from the modulator, and the antenna 11 serving as a transmitting antenna for transmitting the high frequency output of the modulated signal from the filter 9. The transmitter portion TM further comprises an automatic modulation control 12 which is coupled from the transformer 4 to the input of the preamplifier 2 as a feedback loop. The transmitter/receiver selection switch SW2 is coupled to the frequency signal generator 120 for the purpose of switching the operation of the frequency signal generator 120 among the transmitter mode and the receiver mode. The transmitter/receiver selection switch SW3 is coupled to the preamplifier 2 for the purpose of disabling the transmission path between the microphone 1 and the power amplifier 3 in the receiver mode. The transmitter/receiver selection switch SW4 is interposed between the loudspeaker SP and ground, or electrical common, for the purpose of disabling the loudspeaker SP in the transmitter mode. For the purpose of selection of channels, a channel selector 121 is coupled to the frequency signal generator 120. For the purpose of displaying the selected channel, a channel indicator 119 is coupled to the channel selector 121 and the frequency signal generator 120.

FIG. 1 shows a schematic diagram of a major portion of the transmitter portion TM in the FIG. 1A transceiver. It is pointed out that FIG. 1 specifically shows a schematic diagram, partially in a block form, of the microphone 1, a preamplifier interposed between the microphone 1 and the power amplifier 3, the transformer 4, the speaker SP, the final amplifier 10, the low pass filter 9, and the automatic modulation control 12.

The primary winding of the transformer 4 is connected to a positive voltage source VDD1 at one end and is coupled through a diode D1 at the other end to a junction 8. The junction 8 is grounded through a decoupling capacitor C1 to the ground 6. The junction 8 is also connected through a load coil L to the collector of a transistor Q2 which constitutes the final amplifier 10. The base electrode of the transistor Q2 is coupled from the driver amplifier 123. The junction between the load coil L and the collector electrode of the transistor Q2 is connected through a line 7 to the low pass filter 9 to supply the high frequency output of the modulated signal to the low pass filter 9. The decoupling capacitor C1 serves to render the impedance at the junction 8 at a low impedance with respect to the carrier high frequency and at a high impedance with respect to an audio low frequency of several KHz. The load coil L serves also as a portion of the above described low pass filter 9. The transistor Q2 is connected as a C class power amplifier. Therefore, if and when the high frequency input is applied in the transmitter mode to the base electrode of the transistor Q2 the transistor Q2 operates, partially as on/off operable, by virtue of being class C amplifier and an on/off output is developed at the collector electrode of the transistor Q2, which is smoothed by the load coil L and the decoupling capacitor C1 to provide a direct current component at the junction 8. However, since the above described direct current component developed at the junction 8 is lower than the voltage of the direct current source +VDD1, the diode D1 is rendered conductive in the transmitter mode. As a result, the modulation signal as amplified by the power amplifier 3 is allowed to pass through the diode D1 to the final stage amplifier 10. On the other hand, if and when no high frequency input is applied in the receiver mode to the base electrode of the transistor Q2, the transistor Q2 is rendered non-conductive and accordingly the diode D1 is rendered non-conductive. As a result, the modulation signal obtained from the transformer 4 is not allowed to pass through the diode D1 to the final amplifier 10.

The junction 8 is coupled through a line 13 to the automatic modulation control 12. More specifically, the automatic modulation control 12 shown comprises an RC circuit including a capacitor C2 and a variable resistor VR1 for blocking a direct current component, a rectifying circuit including diodes D2 and D3 for rectifying in a voltage doubler manner an alternating current component obtained through the above described RC circuit, a smoothing circuit including a capacitor C3 and a resistor R1, a zener diode D4 for threshold detecting the smoothed output, a further smoothing circuit and an amplifier including a transistor Q3. In operation, a direct current component of the output obtainable at the junction 8 is blocked by the above described RC circuit including the capacitor C2 and only an alternating current component thus obtained is rectified in a voltage doubler manner by the diodes D2 and D3. The rectified output is smoothed by the capacitor C3 and the resistor R1 to provide a smoothed output at the junction 15. If and when the smoothed output exceeds a predetermined threshold level determined by the zener diode D4, the zener diode D4 becomes conductive to provide an output at the anode electrode of the zener diode D4. The threshold detected output is then smoothed by the smoothing circuit and is applied to the base electrode of the transistor Q3, thereby to decrease the impedance between the collector and the emitter electrodes of the transistor Q3. The decrease of the impedance through the transistor Q3 serves to partially shunt the microphone input signal, thereby to reduce the input to the preamplifier 2. The variable resistor VR1 is used to adjust a suitable level for preventing overmodulation. The preamplifier 2 is implemented by a transistor Q1, which is connected between a positive voltage source +VDD3 and the ground.

From the foregoing description, it will be appreciated that according to the automatic modulation control 12 shown the output of the modulation signal amplifier including the preamplifier 2 and the power amplifier 3 obtainable from the junction 8 is applied through the capacitor C2 for the purpose of blocking a direct current component, thereby to provide only an alternating current component, which is then rectified and is smoothed for the purpose of threshold detection. In other words, according to the automatic modulation control 12 shown an average value of the modulation signal is evaluated by way of a rectified and smoothed output, which is then threshold detected at a predetermined threshold level for the purpose of controlling the input level of the preamplifier of the modulation signal. However, it has been observed that such automatic modulation control involves several shortcomings to be described subsequently. Hence, there is room for improvement in the prior art automatic modulation control. Several typical disadvantages encountered by the prior art automatic modulation control as shown will be listed in the following.

(1) Since a signal transmission path in the automatic modulation control comprises the blocking capacitor C2 in series and further comprises other capacitors C3 and C4, while the same includes only the single transistor Q3 as an active device, the feedback gain is not sufficiently large, with the result that a feedback operation is unstable depending on the frequencies and oscillation is caused in the worst situation.

(2) Since the zener diode D4 and the diodes D2 and D3 have a temperature dependent characteristic, modulation is subject to variation of the ambient temperature.

(3) Assuming that the source voltage fluctuates, for example, the source voltage becomes lower, the peak voltage of the carrier wave becomes lower, while the amplitude of the modulation signal is kept unchanged, which could cause overmodulation because of an increase in the modulation factor. Conversely, assuming that the source voltage becomes higher, then the voltage of the carrier wave accordingly increases, while the amplitude of the modulation signal is kept constant, with the result of a decrease of modulation.

(4) Since only the single transistor Q3 is employed as an active device in the automatic modulation control, the gain of the automatic modulation control is small and hence the dynamic range allowing for control of modulation is narrow.

(5) For the above described reasons, the response rate to variation of the modulation factor is slow.

(6) Since the automatic modulation control shown comprises three capacitors having a frequency dependent characteristic, the bias voltage of the transistor Q3 varies in the range where the modulation signal is so large that the automatic modulation control becomes operable, with the result that the operation of the automatic modulation control exhibits a frequency dependent characteristic, i.e. the effect of modulation control is different dependent on the frequencies.

The present invention is aimed to eliminate the above described shortcomings as much as possible.

SUMMARY OF THE INVENTION

Briefly described, the present invention comprises an automatic modulation control in a transmitter, comprising a signal source for providing an alternating modulation signal, a modulation signal amplifier coupled to the modulation signal source and including a modulation signal output transformer, a carrier generator, a modulator coupled to be energized through the modulation signal output transformer for modulating the carrier signal as a function of the output of the modulation signal amplifier, a threshold detector coupled in a direct current manner to the modulation signal output transformer for threshold detecting the modulation signal output at a predetermined threshold level of the alternating modulation signal output, an amplifier for amplifying the threshold detected output, and a control circuit responsive to the amplified output for controlling the input of the modulation signal to the modulation signal amplifier.

According to the present invention, since the modulation signal output is obtained from the modulation signal output transformer in a direct current manner and is subjected to threshold detection at a predetermined threshold level, an alternating current component of the modulation signal output is directly threshold detected at a predetermined threshold level and the threshold detected output thus obtained is used to control the input level of the modulation signal to be applied to the modulation signal amplifier. As a result, most of the previously described shortcomings of the prior art automatic modulation control are eliminated.

Preferably, the modulation signal output transformer and the modulator are connected in series between a reference potential and a voltage source of a given polarity with respect to the reference potential, and the threshold detector is coupled in a direct current manner to the junction between the modulation signal output transformer and the modulator. Preferably, the junction between the modulation signal output transformer and the modulator is coupled through a diode to the threshold detector, the diode being interposed in such a direction that when the voltage at the junction becomes closer to the reference potential than to the voltage of the voltage source the coupling diode tends to be rendered conductive, whereby a wave component of the alternating modulation signal output going in the direction opposite to the above described polarity is selectively applied to the threshold detector, and the threshold detector comprises a switching device adapted to be conductive when the above described selectively withdrawn component exceeds the above described predetermined threshold level. Preferably, the threshold detector comprises a threshold level adjusting means. The above described switching device may comprise a transistor having a common electrode, an input electrode and an output electrode and the junction between the common electrode and the input electrode is selected to be the same polarity as that of the above described coupling diode. Preferably, the output of the threshold detector is smoothed and the smoothed output is applied to the amplifier. Preferably, means are provided for applying a prebias to the threshold detected output amplifier. As a result, the attack time is improved.

Therefore, a principal object of the present invention is to provide an improved automatic modulation control in a transmitter, particularly suited for a transceiver.

Another object of the present invention is to stabilize a feedback operation in an automatic modulation control in a transmitter.

A further object of the present invention is to provide an automatic modulation control in a transmitter wherein modulation is immune to variation of the ambient temperature.

Still a further object of the present invention is to provide an automatic modulation control in a transmitter wherein modulation is immune to fluctuation of a source voltage.

Still another object of the present invention is to provide an automatic modulation control in a transmitter wherein a dynamic range allowing for modulation is wide and a response rate to variation of modulation is quick.

Still a further object of the present invention is to provide an automatic modulation control in a transmitter wherein the operation is not frequency dependent.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
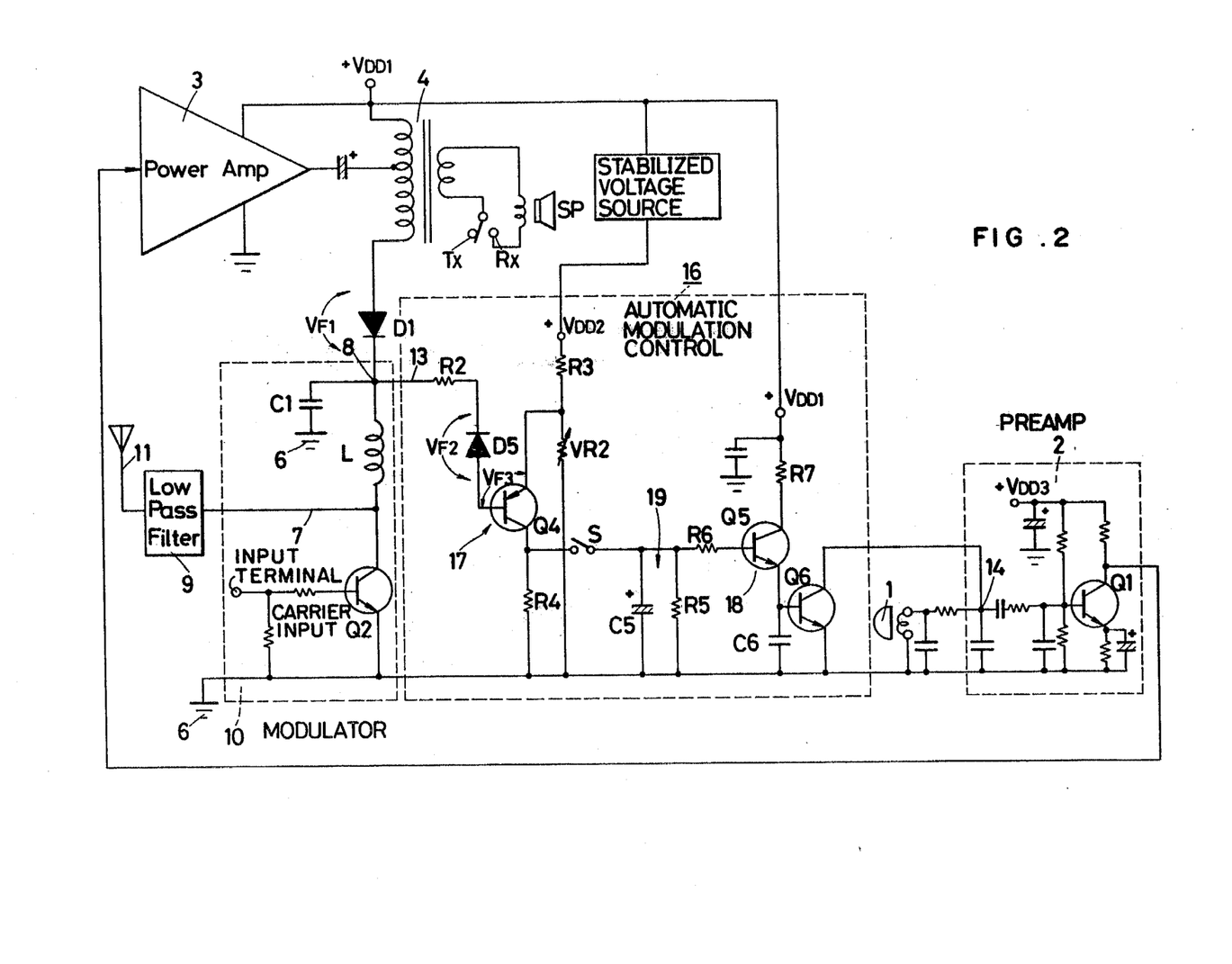
FIG. 2 is similar to FIG. 1 but shows a schematic diagram of one embodiment of the present invention.

FIG. 2 is similar to FIG. 1 but shows a schematic diagram, partially in a block form, of one embodiment of the present invention. It is pointed out that like portions have been denoted by like reference characters. Referring to FIG. 2, the inventive automatic modulation control 16 comprises a threshold detector 17 implemented by a transistor of a PNP type, and a load resistor R4 connected between the collector electrode of the transistor Q4 and ground. The base electrode of the transistor Q4 is connected through a diode D5 and a resistor R2 to the junction 8. The diode D5 is connected in a direction from the base electrode of the transistor Q4 toward the junction 8. The emitter electrode of the transistor Q4 is connected to the junction between a resistor R3 and a variable resistor VR2. The series connection of the resistors R3 and VR2 is connected between a constant volage source +VDD2 and the ground. The variable resistor VR2 is used to adjust a threshold level of the threshold detector 17. The resistor R4 is shown for simplicity of understanding of the operation as a load and is not necessarily required in a practical circuit. The collector electrode of the transistor Q4 serving as an output of the threshold detector 17 is connected through a switch S to a smoothing circuit 19 implemented by a capacitor C5 and a resistor R5. The output of the smoothing circuit 19 is applied through a resistor R6 to an amplifier 18 which is implemented by transistors Q5 and Q6 both of the NPN type. The collector electrode of the transistor Q5 is connected through a resistor R7 to a voltage source +VDD1. The emitter electrode of the transistor Q5 is connected to ground through a bypass capacitor C6 for bypassing the carrier frequency component. The emitter electrode of the transistor Q5 is also connected to the base electrode of the transistor Q6. The collector electrode of the transistor Q6 is connected to the junction 14 between the microphone 1 and the preamplifier 2. The emitter electrode of the transistor Q6 is grounded. The transistors Q5 and Q6 correspond to the transistor Q3 of the FIG. 1 diagram and serve as a modulation signal input control. The purpose of implementing the modulation input control 18 using two transistors Q5 and Q6 is to increase the feedback gain by the automatic modulation control 16, thereby to expand the dynamic range for allowing for modulation. It is pointed out that the switch S is inserted only for facility of understanding of the operation and is not necessarily required in a practical circuit.

According to the embodiment shown, only a negative going component of the alternating modulation signal output obtainable at the junction 8 is selected by means of the diode D5 and is applied to the threshold detector 17, whereby only the negative going component applied in a direct current manner to the threshold detector 17 is threshold detected at a predetermined threshold level adjusted by the variable resistor VR2. The threshold detected output thus obtained is used to control the input of the modulation signal. Therefore, it would be appreciated that the automatic modulation control is operable only when the negative going component exceeds a predetermined threshold level in the negative going direction, which serves to prevent overmodulation. The operation of the FIG. 2 embodiment will be described in more detail in the following.

Figure 3:
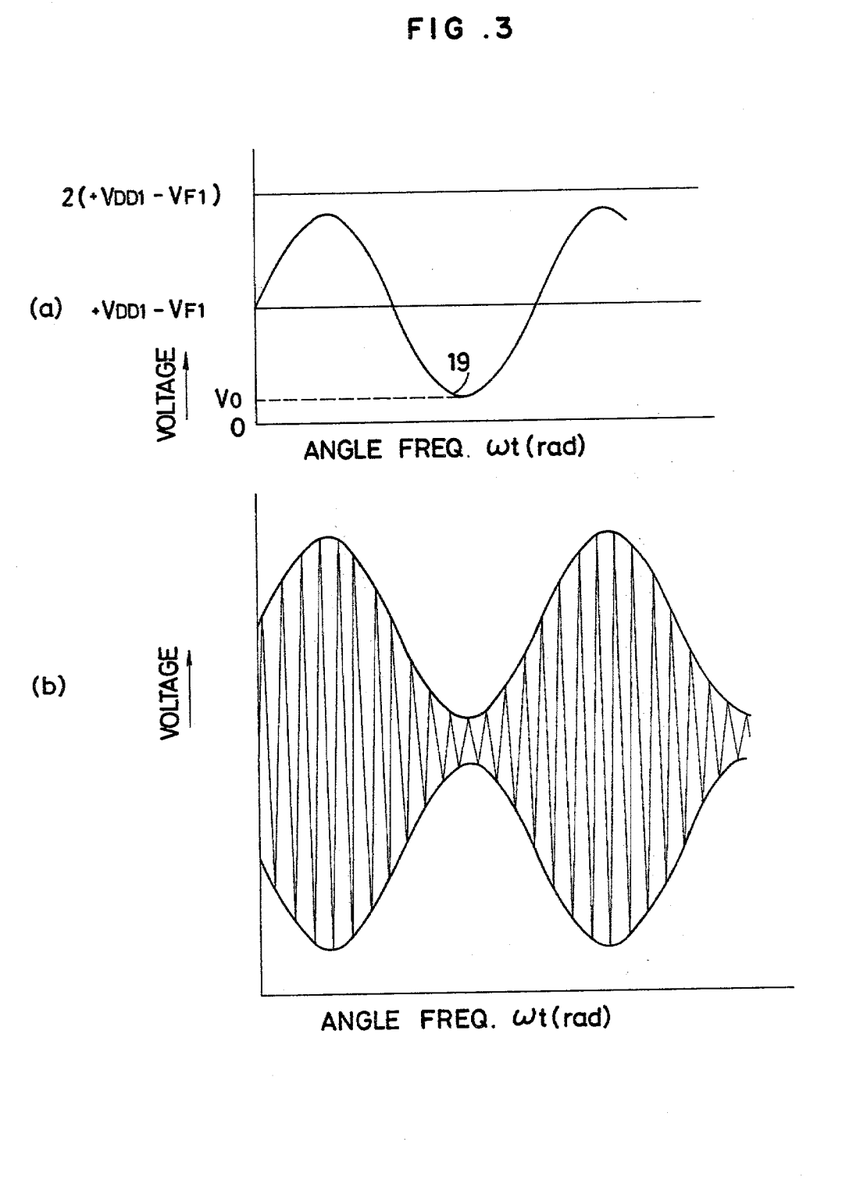
FIG. 3 shows waveforms at several portions in the FIG. 2 embodiment.

If and when a modulation signal is developed across the microphone 1 responsive to a sound, the modulation signal is amplified by the preamplifier 2 and the power amplifier 3 and the amplified modulation signal is obtained at the modulation signal output transformer 4 and is obtained through the diode D1 at the junction 8. The modulation signal output thus obtained is shown in FIG. 3(a). Assuming that a voltage drop across the modulation signal output transformer 4 is neglected, the modulation signal output obtainable at the junction 8 has the operating region from zero volt to 2(+VDD1−VF1) with [+VDD1 (source voltage)−VF1 (the forward voltage of the diode D1] as the center of such signal. Therefore, without the automatic modulation control, if and when the amplitude of the modulation signal output exceeds the above described region, the modulated output becomes saturated and clipped. The modulator 10 serves to modulate the carrier signal as a function of the modulation signal obtainable at the junction 8, whereby a modulated output is obtained at the collector electrode of the transistor Q2. The waveform of the modulated output is shown in FIG. 3(b). It will be appreciated that if and when the modulation signal output obtainable at the junction 8 swings from zero volt to 2(+VDD1−VF1), i.e. the amplitude of the modulation signal output is 2(+VDD1−VF1), the modulation factor becomes 100%, and if the modulation signal output exceeds the above described value, overmodulation occurs. Accordingly, in order to prevent overmodulation, it is necessary to prevent the modulation signal output obtainable at the junction 8 from being clipped.

Figure 4:
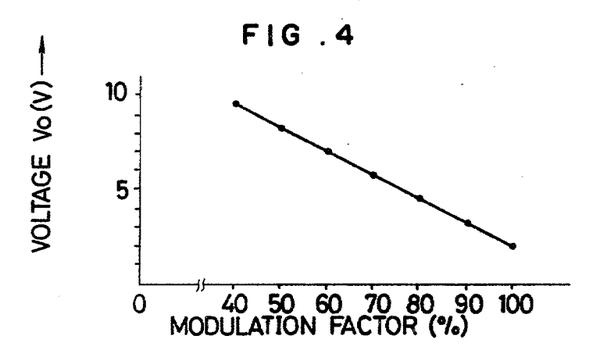
FIG. 4 is a graph showing a relation between the modulation factor and a negative going peak value of the modulated output voltage.

FIG. 4 is a graph showing the relation between a negative going peak value V0, i.e. a voltage difference between the negative going peak point 19 of the modulation signal output obtainable at the junction 8 and zero volt, and the modulation factor of the modulated signal. Although the relation between the negative going peak value V0 and the modulation factor of the modulated signal more or less differs depending on the characteristic of the power amplifier 3 per se, the FIG. 4 graph shows a case where the negative going peak value V0 is approximately 2 V at 100% amplitude modulation and is approximately 3 V at 90% amplitude modulation. In order to avoid the modulation factor exceeding 90% amplitude modulation, therefore, it would be appreciated that it is necessary to apply a negative feedback operation to the microphone input signal such that the negative going peak value V0 of the modulation signal output obtainable at the junction 8 may not become lower than 3 V.

Now returning to FIG. 2, description will be made of how the FIG. 2 embodiment should be operated in order to avoid the modulation factor exceeding 90% amplitude modulation. In order to limit the modulation factor up to the maximum of 90% amplitude modulation, the variable resistor VR2 should be adjusted such that the emitter voltage of the transistor Q4 becomes [(V0=3 V)+VF2+VF3], where VF2 is a forward voltage of the diode D5 and VF3 is a forward voltage of the emitter-base junction, Vbe, of the transistor Q4.

Figure 5:
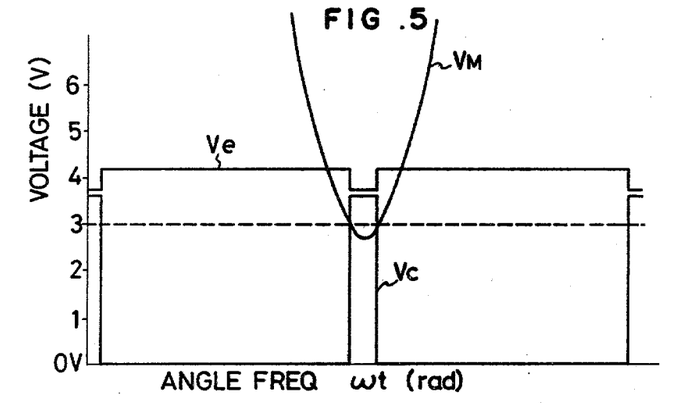
FIG. 5 is a graph showing a relation between the modulated output voltage and the voltage at the switching transistor forming the threshold detector.

Now consider a case where the above described switch S has been opened so that a feedback loop from the output to the input of the preamplifier 2 and the power amplifier 3, i.e. a feedback loop from the junction 8 to the input terminal 14 of the preamplifier 2, may not be formed. If and when the variable resistor VR2 is adjusted such that the maximum of 90% amplitude modulation may be attained as described previously, a change of the voltage at the junction 8 becoming lower than 3 V causes the switching transistor Q4 to be conductive, whereby the collector voltage of the transistor Q4 increases. FIG. 5 is a graph showing a relation between the modulation signal output and the voltage of the switching transistor Q4 forming the threshold detector, wherein the abscissa indicates the time and the ordinate indicates the voltage, VM denoting the waveform of the modulation signal output in the vicinity of the negative going peak point 19 in FIG. 3, and VE and VC denoting the emitter and collector voltages of the switching transistor Q4. Referring to FIG. 5, it would be appreciated that if and when the variable resistor VR2 has been adjusted to achieve a threshold level for the maximum of 90% amplitude modulation, a change of the modulation signal output VM obtainable at the junction 8 exceeding 3 V causes the transistor Q4 to be cut off and a change of the modulation signal output VM becoming lower than 3 V causing modulation exceeding the above described maximum value renders the switching transistor Q4 conductive such that a collector current flows through the transistor Q4, with the result of an increase of the collector voltage VC. As a matter of course, a flow of the collector current through the transistor Q4 decreases the emitter voltage VE of the transistor Q4.

Now consider a case where the switch S is closed. When a modulation signal causing the modulation exceeding 90% amplitude modulation is developed across the microphone 1, the modulation signal output causing such modulation exceeding 90% amplitude modulation is obtained at the junction 8, which render the switching transistor Q4 conductive, which increases the collector voltage of the transistor Q4. Such threshold detected output obtained at the collector electrode of the transistor Q4 is smoothed by the smoothing circuit implemented by the capacitor C5 and the resistor R5 and the smoothed output is applied through the resistor R6 to the base electrode of the transistor Q5. As a result, the transistor Q5 and thus the transistor Q6 are rendered conductive, such that the base current flows in each of the transistors Q5 and Q6. As described previously, the input terminal 14 of the preamplifier 2 for a modulation signal preamplification is shunted by the transistor Q6. Since the impedance of the transistor Q6 from the collector electrode to the emitter electrode decreases by virtue of conduction thereof, the input signal level applied to the transistor Q1 of the preamplifier 2 is accordingly decreased. Thus, a negative feedback loop is formed from the output of the modulation signal amplifying circuit including a preamplifier 2 and the power amplifier 3 to the input of the above described modulation signal amplifying circuit.

Thus, according to the FIG. 2 embodiment, if and when a modulation signal developed by the microphone becomes too large, the negative going peak value V0 of the modulation signal output obtainable at the junction 8 tends to exceeds the predetermined threshold level 3 V in a negative going direction, when the automatic modulation control 16 becomes operable to threshold detect the negative going component of the modulation signal output at the above described threshold level, thereby to reduce the modulation signal input level of the preamplifier 2, suh that the negative going peak value V0 of the modulation signal output is suppressed from exceeding the above described predetermined level and thus the modulation degree is suppressed from exceeding the above described predetermined value of 90% amplitude modulation.

Since the FIG. 2 embodiment utilizes the smoothing circuit for smoothing the threshold detected output implemented by the capacitor C5 and the resistor R5, an unstable variation of the collector voltage of the transistor Q4 is absorbed by the smoothing circuit, whereby the operation of the transistors Q5 and Q6 is stabilized. As a result, a stabilized control of modulation is achieved.

According to the FIG. 2 embodiment, the relation between the modulation factor and the negative going peak value V0 of the modulation signal output obtained at the junction 8 which is the anode of the diode D1 coupled to the output side of the modulation signal output transformer 4 is immune to variation of the source voltage, i.e. is shown as FIG. 3(b) irrespective of variation of the source voltage +VDD1. The reason of this will be described in the following.

If and when the source voltage +VDD1 increases, the center of the modulation signal output is accordingly raised, which tends to raise the negative going peak value V0 of the modulation signal output. Then, the base current of the switching transistor Q4 accordingly decreases, which tends to decrease the collector voltage of the transistor Q4. The decrease of the collector voltage of the transistor Q4 decreases the base current of the transistors Q5 and Q6 and accordingly increases the impedance of the transistor Q6. As a result, the modulation input signal level at the input terminal of the preamplifier 2 increases, which increases the modulation signal output obtainable at the junction 8 of the modulation signal output transformer 4. Since the increase of the modulation signal output means an increase of the amplitude of the modulation signal output, the negative going peak value V0 tends to decrease. When the negative going peak value of the modulation signal output decreases too much, conversely the base current of the switching transistor Q4 increases. However, according to the FIG. 2 embodiment, the emitter electrode of the switching transistor Q4 is connected to the stabilized voltage source +VDD2. Therefore, if and when the base current of the switching transistor Q4 increases, the collector voltage of the switching transistor Q4 accordingly increases, which increases the base current of the transistors Q5 and Q6, with the result that the impedance of the transistor Q6 decreases. As a result, the modulation signal input level at the input terminal 14 of the preamplifier 2 is accordingly reduced and the modulation signal output obtainable at the junction 8 is accordingly decreased, whereby the negative going peak value V0 of the modulation signal output tends to increase. The above described operation is repeated while the negative going peak value V0 of the modulation signal output reaches the predetermined threshold level adjusted by the variable resistor VR2. Conversely, even if the source voltage +VDD1 decreases, the automatic modulation control 16 operates in the similar manner and the negative going peak value V0 of the modulation signal output is maintained in a constant level.

Thus, according to the FIG. 2 embodiment, since the switching transistor Q4 forming the threshold detector 17 is connected to be energized by the constant voltage source +VDD2, the threshold detector 17 operates to control the modulation signal input level at the input terminal 14 of the preamplifier solely responsive to a variation of the negative going peak value V0 of the modulation signal output and thus responsive to an increase or decrease of the base current of the switching transistor Q4, whereby the negative going peak value V0 of the modulation signal output tends to be maintained constant.

Figure 2A:
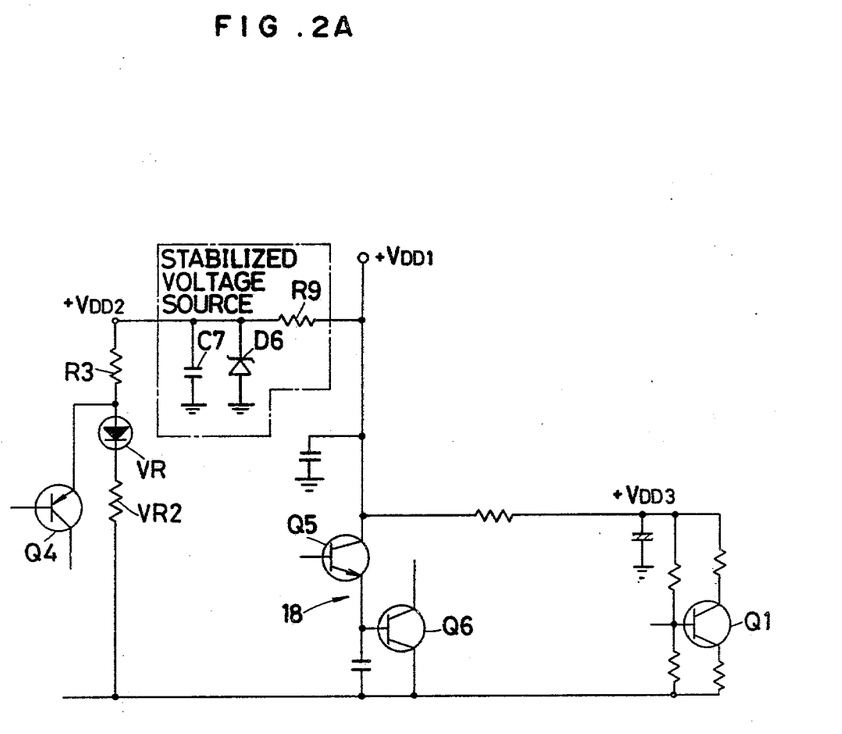
FIG. 2A is a schematic diagram of a constant voltage source.

FIG. 2A shows a schematic diagram of the stabilized voltage source +VDD2. Typically, the constant voltage source +VDD2 may comprise a decoupling resistor R9 coupled to the voltage source +VDD1 and a decoupling capacitor C7 connected to the ground, shunted by a zener diode D6.

From the foregoing description, it would be appreciated that according to the FIG. 2 embodiment the negative going peak value V0 of the modulation signal output obtainable at the junction 8 is maintained in a constant value, say 3 V, irrespective of variation of the source voltage +VDD1 and thus the modulation factor is maintained in the maximum value of 90% amplitude modulation. This means that the first mentioned requirement (2) of no variation in the modulation factor irrespective of variation of the source voltage is achieved.

According to the FIG. 2 embodiment, the feedback loop including the automatic modulation control 16 formed from the output of the modulation signal amplifying circuit including the preamplifier 2 and the power amplifier 3 to the input of the modulation signal amplifying circuit does not include any components exhibiting a frequency dependent characteristic in the signal transmission path from the junction 8 to the threshold detector 17. Therefore, the peak value V0 of the modulation signal output obtainable at the junction 8 is detected to control the modulation signal input level of the preamplifier 2. As a result, the automatic modulation control 16 shown does not exhibit a frequency dependent characteristic with respect to the frequencies of the modulation signal input. Thus, the first mentioned requirement (5) is also achieved by the FIG. 2 embodiment. This will be described again subsequently with reference to FIG. 8.

According to the FIG. 2 embodiment, no components exhibiting a frequency dependent characteristic have been used in series with the signal transmission path in the automatic modulation control, while three transistors Q4, Q5 and Q6 have been utilized as active devices, which achieve a larger feedback gain. As a result, a stabilized feedback operation is performed with respect to any frequency components in the necessary frequency band, while overmodulation is prevented. Thus, the first mentioned requirement (1) is also met by the FIG. 2 embodiment.

According to the FIG. 2 embodiment, the switching transistor Q4 of an active device has been used in place of a zener diode, a diode, or the like of passive devices, while the modulation signal input control 18 is implemented by two-stage transistors Q5 and Q6. As a result, an increased feedback gain is achieved by the automatic modulation control 16 and thus the dynamic range allowing for modulation control is expanded. This means that the first mentioned requirement (4) is also met by the FIG. 2 embodiment. More specifically, since the gain is provided by employing three transistors Q4, Q5 and Q6, a rise characteristic until the modulation factor reaches a predetermined saturation region becomes abrupt, while the modulation signal input causing overmodulation is expanded to a large value and the modulation factor characteristic curve with respect to the modulation signal input becomes flat within the saturation region of the modulation factor by means of the transistors Q5 and Q6.

According to the FIG. 2 embodiment, the feedback gain of the automatic modulation control 16 is relatively large, as described previously. As a result, a response rate to variation of the modulation factor becomes quick. Thus, the first mentioned requirement (3) is also achieved by the FIG. 2 embodiment.

Figure 6:
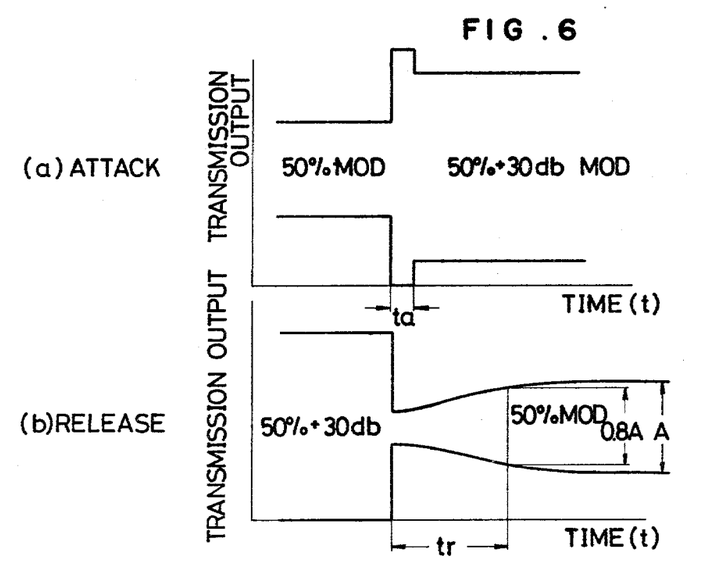
FIG. 6 are waveforms showing a response rate of the inventive automatic modulation control.

FIG. 6 shows the response characteristics of the automatic modulation control, wherein the waveforms (a) show an attack time ta or a response time in case where the signal developed by the microphone 1 is changed from the input level of 50% amplitude modulation to the input level of 50% amplitude modulation plus 30 dB and the waveforms (b) show a release time tr or a response time in case where the signal developed by the microphone 1 is changed from the input level of 50% amplitude modulation plus 30 dB to the input level of 50% amplitude modulation.

Experimentation with the FIG. 2 embodiment showed that the attack time ta is approximately 30 m sec and the release time tr is approximately 300 m sec. By contrast, experimentation by the FIG. 1 prior art circuit showed that the attack time is approximately 50 m sec and the release time is approximately 700 m sec. Thus, it would be appreciated that the response time has been much improved by the FIG. 2 embodiment as compared with the FIG. 1 prior art circuit.

Figure 7:
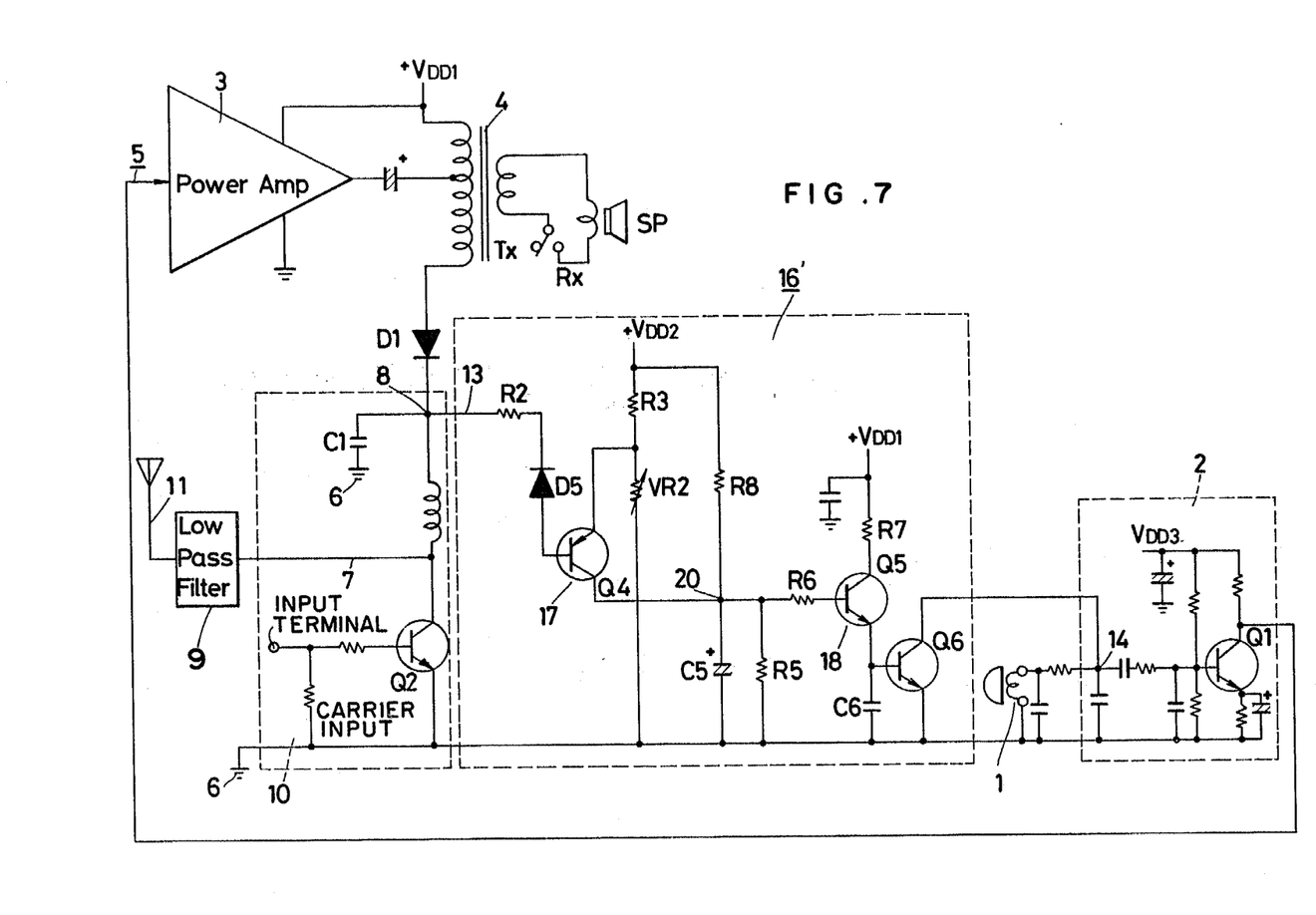
FIG. 7 is similar to FIG. 2 but shows a schematic diagram of another embodiment of the present invention.

FIG. 7 is similar to FIG. 2 but shows a schematic diagram of a modification of the FIG. 2 embodiment. More specifically, the FIG. 7 embodiment had been modified to shorten the above described attack time ta. To that end, the FIG. 7 embodiment comprises a resistor R8 coupled between the collector electrode of the transistor Q4 and the voltage source +VDD2. Since the other portions of the FIG. 7 embodiment are the same as those in the FIG. 2 embodiment, it is not believed necessary to describe the same again in detail. With such modification, even when the modulation signal input is so small as not to cause the automatic modulation control 16 operable, a predetermined bias voltage is applied to the base electrode of the transistor Q5 by way of a voltage division by means of the resistors R8 and R5. Therefore, when the modulation signal input becomes large to cause the automatic modulation control 16' operable, an excellent response of the transistor Q5 and thus an excellent response of the automatic modulation control 16' is achieved. This will be described in more detail in the following. With such modification as shown in FIG. 7, even when the modulation signal input is so small as not to cause the switching transistor Q4 of the automatic modulation control 16' to be conductive, the capacitor C5 is kept charged by a current flowing through the resistor R8 from the voltage source +VDD2 and the base electrode of the transistor Q5 is biased to such a predetermined value as not to cause the transistor Q5 to be conductive. Therefore, if and when the modulation signal input becomes large to cause the switching transistor Q4 to be conductive, the transistor Q5 can be immediately responsive to the conductive state of the switching transistor Q4 to be turned on, thereby to control the modulation factor. Thus, the attack time ta is shortened.

Experimentation with the FIG. 7 embodiment showed that the attack time ta is approximately 10 m sec. This means that particularly the attack time has been much improved as compared with the FIG. 2 embodiment.

Figure 8:
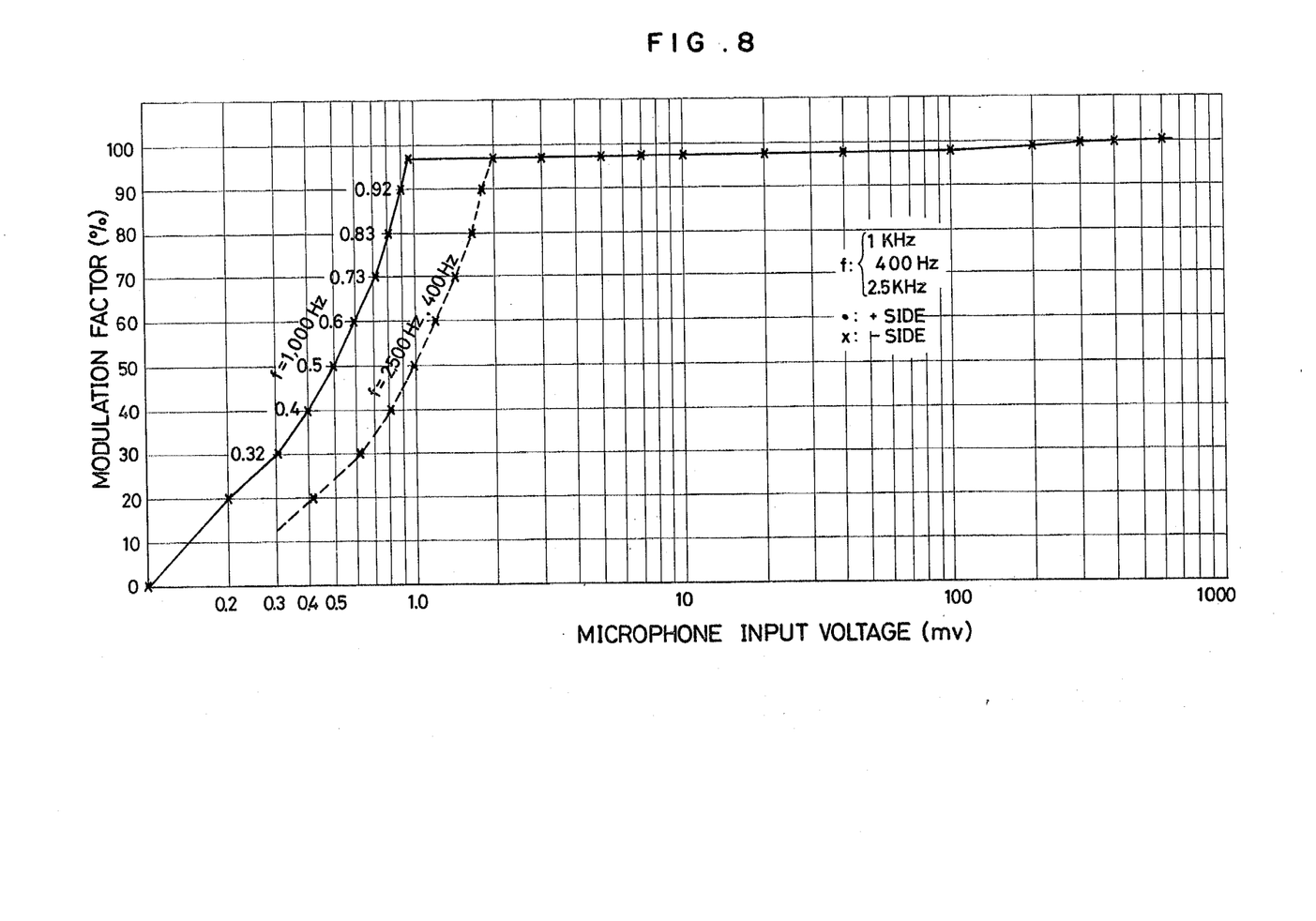
FIG. 8 is a graph showing a characteristic between a microphone input voltage and the modulation factor in accordance with the inventive automatic modulation control.

FIG. 8 is a graph showing the characteristic of modulation factor versus modulation signal input, with the frequencies 1000 Hz, 400 Hz and 2500 Hz of the modulating signal as a parameter, the measurement being made of the modulation factors with respect to both the positive and negative components. It is pointed out that the measurement was made with the embodiments adjusted to the maximum value of 98% amplitude modulation. Referring to the FIG. 8 characteristic, the following matters are seen.

(1) In case of the frequency of 1000 Hz, for example, the microphone input voltage level necessary for 50% amplitude modulation is 0.5 mV.

(2) In case of the frequency of 1000 Hz, for example, an increase of the microphone input voltage by +6 dB (1 mV) from the input level of 50% amplitude modulation (0.5 mV) reaches a saturation region.

(3) The frequency characteristic in a non-saturated region is such that the frequencies of 400 Hz and 2500 Hz are −6 dB with the frequency of 1000 Hz as the center.

(4) In case of the frequency of 1000 Hz, for example, an increase of the microphone input voltage from 50% amplitude modulation does not reach 100% amplitude modulation even with respect to the microphone input voltage (500 mV) of 1000 times (60 dB).

(5) In the saturated region a frequency independent characteristic is obtained, i.e. the characteristic does not exhibit any frequency dependent characteristic.

(6) Approximately 98% amplitude modulation is performed up to the modulation signal input of 60 dB (500 mV) with respect to the respective frequencies.

From the foregoing description, it would be appreciated that both the FIG. 2 embodiment and the FIG. 7 embodiment bring about the excellent characteristics of an automatic modulation control.

The result of experimentation as regards the temperature characteristic within the range of +60° to −30° revealed that no problem occurs in the embodiments shown in FIGS. 2 and 7. This means that the first mentioned requirement (2) is also achieved by the embodiments shown in FIGS. 2 and 7, as far as a variation of the ambient temperature is concerned. However, if it is desired to fully compensate for a variation of the ambient temperature, a varistor may be inserted between the emitter electrode of the transistor Q4 and the ground, in series with the variable resistor VR2, as shown in FIG. 2A.

As seen from the FIGS. 2 and 7 diagrams, a circuit configuration of the automatic modulation controls 16 and 16' is rather simple. Adjustment of the maximum amplitude modulation factor can be achieved by simply adjusting the variable resistor VR2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic modulation control in a transmitter comprising:
    a source of direct current operating voltage, means for providing an alternating current modulation signal,
    means coupled to said modulation signal providing means for amplifying said modulation signal,
    a modulation signal output transformer means coupled to said amplifying means and to said source to produce a composite signal of said modulation signal with a direct current voltage component,
    means for generating a carrier wave signal,
    means coupled to said modulation signal output transformer means for modulating said carrier wave signal with said modulation signal as a function of the output of said modulation signal amplifying means,
    means connected in a direct current manner to said modulation signal output transformer means for threshold detecting said composite signal at a predetermined threshold level of the alternating current modulation signal output as established by the direct current voltage component, and
    control means coupled to said detecting means and responsive to said threshold detected output for controlling the amplitude of said modulation signal applied to said modulation signal amplifying means by said modulation signal providing means.

2. An automatic modulation control in a transmitter in accordance with claim 1, which further comprises reference potential means,
    said modulation signal output transformer means and said modulating means being connected in series between said source of direct current operating voltage and said reference potential means, and means for coupling the junction between said modulation signal output transformer means and said modulating means in a direct current manner to said threshold detecting means.

3. An automatic modulation control in a transmitter in accordance with claim 2, wherein said threshold detecting means comprises switching means adapted to be conductive when said alternating current modulation output exceeds said predetermined threshold level.

4. An automatic modulation control in a transmitter in accordance with claim 3, wherein said switching means comprises transistor means having a common electrode, an input electrode and an output electrode.

5. An automatic modulation control in a transmitter in accordance with claim 4, wherein said direct current coupling means comprises diode means interposed between said junction of said modulation signal output transformer means and said modulating means and said threshold detecting means and poled such that when the voltage at said junction becomes closer to the reference potential of said reference potential means than to the voltage of said voltage source means said diode means tends to be rendered conductive, and the junction between said common electrode and said input electrode of said transistor means is selected to be the same polarity as that of said coupling diode means, whereby said transistor means is protected.

6. An automatic modulation control in a transmitter in accordance with claim 5, which further comprises means for selectively setting said predetermined threshold level of said detecting means.

7. An automatic modulation control in a transmitter in accordance with claim 6, wherein said common electrode is coupled to said means for selectively setting said predetermined threshold level.

8. An automatic modulation control in a transmitter in accordance with claim 7, wherein said threshold level setting means is coupled to said direct current voltage source, said input electrode of said transistor means is coupled to said coupling diode means, and said output electrode of said transistor means is coupled to said reference potential means.

9. An automatic modulation control in a transmitter in accordance with claim 8, which further comprises means for stabilizing the voltage applied to said threshold level setting means.

10. An automatic modulation control in a transmitter in accordance with claim 1 further comprising means coupled to said threshold detecting means for amplifying the threshold detected output.

11. An automatic modulation control in a transmitter in accordance with claim 1, which further comprises smoothing means coupled to said threshold detecting means for smoothing said threshold detected output.

12. An automatic modulation control in a transmitter in accordance with claim 10, which further comprises means for applying a bias voltage to said threshold detected output amplifying means for shortening the attack time of said automatic modulation control.

13. An automatic modulation control in a transmitter in accordance with claim 12, wherein said bias voltage applying means comprises a stable voltage source means and resistor means coupled between said stable voltage source means and the input of said means for amplifying said threshold detected output.

* * * * *